United States Patent
Heo

(10) Patent No.: US 8,401,114 B2
(45) Date of Patent: Mar. 19, 2013

(54) MOBILE TELECOMMUNICATION DEVICE AND RAMPING DATA TRANSMITTING METHOD THEREOF

(75) Inventor: Jung-Hun Heo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 933 days.

(21) Appl. No.: 12/493,701

(22) Filed: Jun. 29, 2009

(65) Prior Publication Data

US 2009/0323862 A1 Dec. 31, 2009

(30) Foreign Application Priority Data

Jun. 30, 2008 (KR) .................. 10-2008-0062420

(51) Int. Cl.
*H04K 1/10* (2006.01)
*H04L 25/03* (2006.01)
*H04L 25/49* (2006.01)

(52) U.S. Cl. ................. 375/297; 375/295; 375/296

(58) Field of Classification Search ............ 375/297
See application file for complete search history.

(56) References Cited

U.S. PATENT DOCUMENTS

| | | | |
|---|---|---|---|
| 7,903,613 B2* | 3/2011 | Ozluturk et al. ............ 370/335 |
| 2002/0168025 A1* | 11/2002 | Schwent et al. ............ 375/297 |
| 2005/0014524 A1 | 1/2005 | Lott et al. |
| 2005/0201280 A1 | 9/2005 | Lundby et al. |
| 2006/0154626 A1* | 7/2006 | Maerzinger et al. ....... 455/127.1 |
| 2008/0095195 A1* | 4/2008 | Ahmadi et al. ............ 370/478 |
| 2008/0233945 A1* | 9/2008 | Gummadi et al. .......... 455/422.1 |
| 2008/0233958 A1* | 9/2008 | Robbins et al. ............ 455/436 |
| 2009/0131066 A1* | 5/2009 | Barve et al. ............... 455/452.2 |
| 2010/0222051 A1* | 9/2010 | Watanabe et al. .......... 455/422.1 |
| 2011/0134974 A1* | 6/2011 | Green et al. ............... 375/220 |
| 2011/0230145 A1* | 9/2011 | Lim et al. ................ 455/73 |
| 2012/0069759 A1* | 3/2012 | Gummadi et al. ........... 370/252 |

* cited by examiner

*Primary Examiner* — Erin File
(74) *Attorney, Agent, or Firm* — Volentine & Whitt, PLLC

(57) ABSTRACT

A mobile telecommunication device includes a digital baseband processing unit and an analog baseband processing circuit. The digital baseband processing unit is configured to extract a difference value of current ramping data of ramping data of ramping samples of a ramping profile from previous ramping data, the current ramping data and the previous ramping data having a first bit number, and to transmit the difference value to the analog baseband processing unit as sample difference ramping data having a second bit number which is smaller than a first bit number. The analog baseband processing unit configured to receive the sample difference ramping data, and to generate a ramping up/down signal of the first bit number based on the sample difference ramping data, wherein the ramping up/down signal controls an output power level of the mobile telecommunication device.

20 Claims, 7 Drawing Sheets

MOBILE TELECOMMUNICATION DEVICE AND RAMPING DATA TRANSMITTING METHOD THEREOF

CROSS-REFERENCE TO RELATED APPLICATIONS

A claim of priority under 35 U.S.C. §119 is made to Korean Patent Application 10-2008-0062420, filed Jun. 30, 2008, the contents of which are hereby incorporated by reference in their entirety as if fully set forth herein.

BACKGROUND

The present invention generally relates to mobile telecommunication devices, and to the transmission of ramping data in mobile telecommunication devices.

A mobile telecommunication device, such as a mobile phone, generally includes Digital Baseband (DBB) chip and an Analog Baseband (ABB) or Radio Frequency (RF) chip. An example of ABB includes GSM (Global System for Mobile communication)/EDGE (Enhanced Data Rates For GSM Evolution). The ABB or RF chip is equipped with a ramp generator to perform a ramping-up and ramping-down of an output power level in a GMSK (Gaussian Minimum Shift Keying) or 8PSK (8 Phase Shift Keying) mode.

The ramping operation must be performed at leading edge and trailing edge of each transmission burst. Thus, the DBB chip (or processing unit) must transmit an appropriate ramping profile to a ramping memory adapted in the ABB or RF chip (or processing unit) before initiation of each transmission burst.

The ABB or RF processing unit receives a ramping waveform applied from the DBB processing unit, as digital data through a serial interface, and stores the same in ramping memory. In operation, a large quantity of ramping data is transmitted periodically through the serial interface, and as a result, noise may be generated in the ABB or RF processing unit. In addition, an additional data processing burden is placed upon the DBB processing unit.

SUMMARY OF THE INVENTION

As mentioned above, the present invention generally relates to mobile telecommunication devices, and to the transmission of ramping data in a mobile telecommunication device.

According to a non-limiting aspect of the invention, a method of transmitting ramping data of ramping samples of a ramping profile from a digital baseband processing unit to an analog baseband processing unit is provided. The method includes extracting a difference value of current ramping data from previous ramping data, the current ramping data and the previous ramping data having a first bit number, and transmitting the difference value to the analog baseband processing unit as sample difference ramping data having a second bit number which is smaller than a first bit number.

According to another non-limiting aspect of the invention, a mobile telecommunication device includes a digital baseband processing unit and an analog baseband processing circuit. The digital baseband processing unit is configured to extract a difference value of current ramping data of ramping data of ramping samples of a ramping profile from previous ramping data, the current ramping data and the previous ramping data having a first bit number, and to transmit the difference value to the analog baseband processing unit as sample difference ramping data having a second bit number which is smaller than a first bit number. The analog baseband processing unit is configured to receive the sample difference ramping data, and to generate a ramping up/down signal of the first bit number based on the sample difference ramping data, wherein the ramping up/down signal controls an output power level of the mobile telecommunication device.

According to still another non-limiting aspect of the invention, a mobile telecommunication device includes a digital baseband processing unit and a radio frequency processing circuit. The digital baseband processing unit is configured to extract a difference value of current ramping data from previous ramping data, the current ramping data and the previous ramping data having a first bit number, and to transmit the difference value to the analog baseband processing unit as sample difference ramping data having a second bit number which is smaller than a first bit number. The radio frequency processing unit is configured to receive the sample difference ramping data, and to generate a ramping up/down signal of the first bit number based on the sample difference ramping data, wherein the ramping up/down signal controls an output power level of the mobile telecommunication device.

BRIEF DESCRIPTION OF THE DRAWINGS

The present invention will become more fully understood from the detailed description given hereinbelow and with reference to the accompanying drawings which are given by way of illustration only, and thus are not limitative of the present invention, and wherein.

DETAILED DESCRIPTION OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather these embodiments are provided so that this disclosure will be thorough and complete, and will fully convey the inventive scope to those skilled in the art.

Unless otherwise defined, all terms (including technical and scientific terms) used herein have the same meaning as commonly understood by one skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Embodiments of the present invention are more fully described below with reference to the accompanying drawings. This invention may, however, be embodied in many different forms and should not be construed as being limited to the embodiments set forth herein; rather, these embodiments are provided so that this disclosure is thorough and complete, and conveys the inventive concept to those skilled in the art.

A mobile telecommunication device and a ramping data transmitting method thereof are described below.

Figure 1:
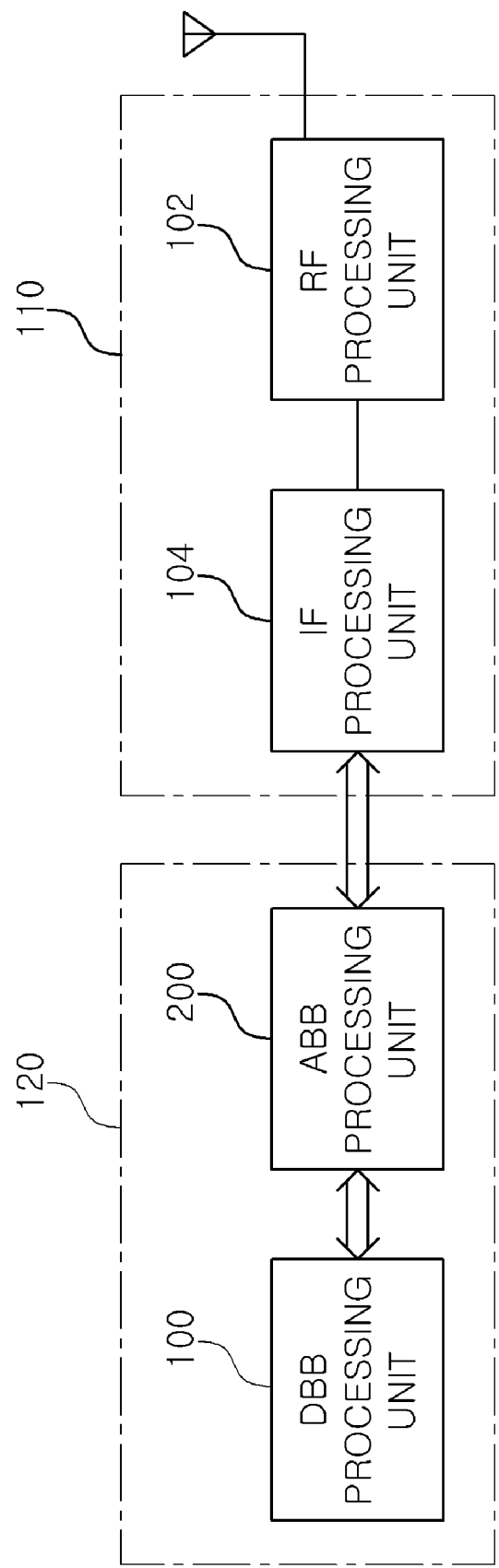
FIG. 1 is a block diagram of mobile telecommunication device according to an embodiment of the invention.

Referring first to FIG. 1 illustrating a block diagram of mobile telecommunication device according to an embodiment of the invention, there are shown a baseband processing unit 120 including a digital baseband (DBB) processing unit 100 and an analog baseband (ABB) processing unit 200, and a radio frequency processing unit 110 including an intermediate frequency (IF) processing unit 104 and a high-frequency radio frequency (RF) processing unit 102.

In a receiving mode, the RF processing unit 102 performs an intermediate frequency conversion based on a conversion into an IF signal, or a direct conversion based on a direct conversion into a baseband signal by demodulating an RF signal received from an antenna. Further, in a transmitting mode, the RF processing unit 102 modulates a signal of the baseband or the IF signal and transmits the modulated signal to the antenna. The IF processing unit 104 is applied when using the IF conversion, and converts the IF signal into a baseband signal in a receiving operation, and converts a baseband signal into an IF signal in a transmission operation. In a receiving mode, the analog baseband processing unit 200 performs an analog/digital conversion for an inputted-analog baseband signal, and converts a sampling rate and transmits it to the digital baseband processing unit 100. In a transmission mode, the analog baseband processing unit 200 converts a sampling rate of received-digital signal and then performs a digital/analog conversion and outputs an analog baseband signal. The digital baseband processing unit 100 primarily performs a signal demodulation and a channel decoding in the receiving mode, and primarily performs a signal modulation and a channel coding in the transmitting mode.

Generally, two methods of generating a ramping signal in the ABB processing unit 200 of FIG. 1 are available. In one method, before transmitting one frame, all ramping profiles related to ramping-up and down are stored in a ramp memory of the ABB processing unit 200, and then an adequate ramping profile is loaded by transmitting a control signal. In the other another method, a ramping profile is determined and transmitted each time the ramping signal is generated.

In the former method, the frequency of data transmission of the DBB processing unit 100 can be reduced, thereby lessening a loading of a controller adapted within the DBB processing unit 100. However, a relatively large capacity memory or multiple smaller-capacity memories are required within the ABB processing unit 200. In the latter method, the memory capacity within the ABB processing unit 200 is reduced, but ramping data must be received each time from the DBB processing unit 100, before a ramping event is generated, and a large quantity of ramping data is therefore transmitted through a serial interface, thus noise may affect the ABB processing unit or RF chip.

Regardless of the method adopted, it is desirable to reduce the quantity of ramping profile data transmitted from the DBB processing unit 100 to the ABB processing unit 200.

As explained below, in an embodiment of the invention, when transmitting ramping data, the digital baseband processing unit 100 extracts a difference value of ramping data from a previous ramping sample, and dataizes and transmits the difference value as sample difference ramping data having a second bit number which is smaller than a first bit number, without transmitting the ramping data of the first bit number for the ramping sample to be transmitted. The analog baseband processing unit 200 receives the sample difference ramping data and generates a ramping up/down signal of the first bit number as a signal for controlling an output power level. Accordingly, a transmission amount of ramping data transmitted through a serial interface is reduced, thereby substantially lessening a noise effect at a receiving party. Further, the capacity of ramp memory accessed by a ramp generator may be advantageously reduced.

Figure 2:
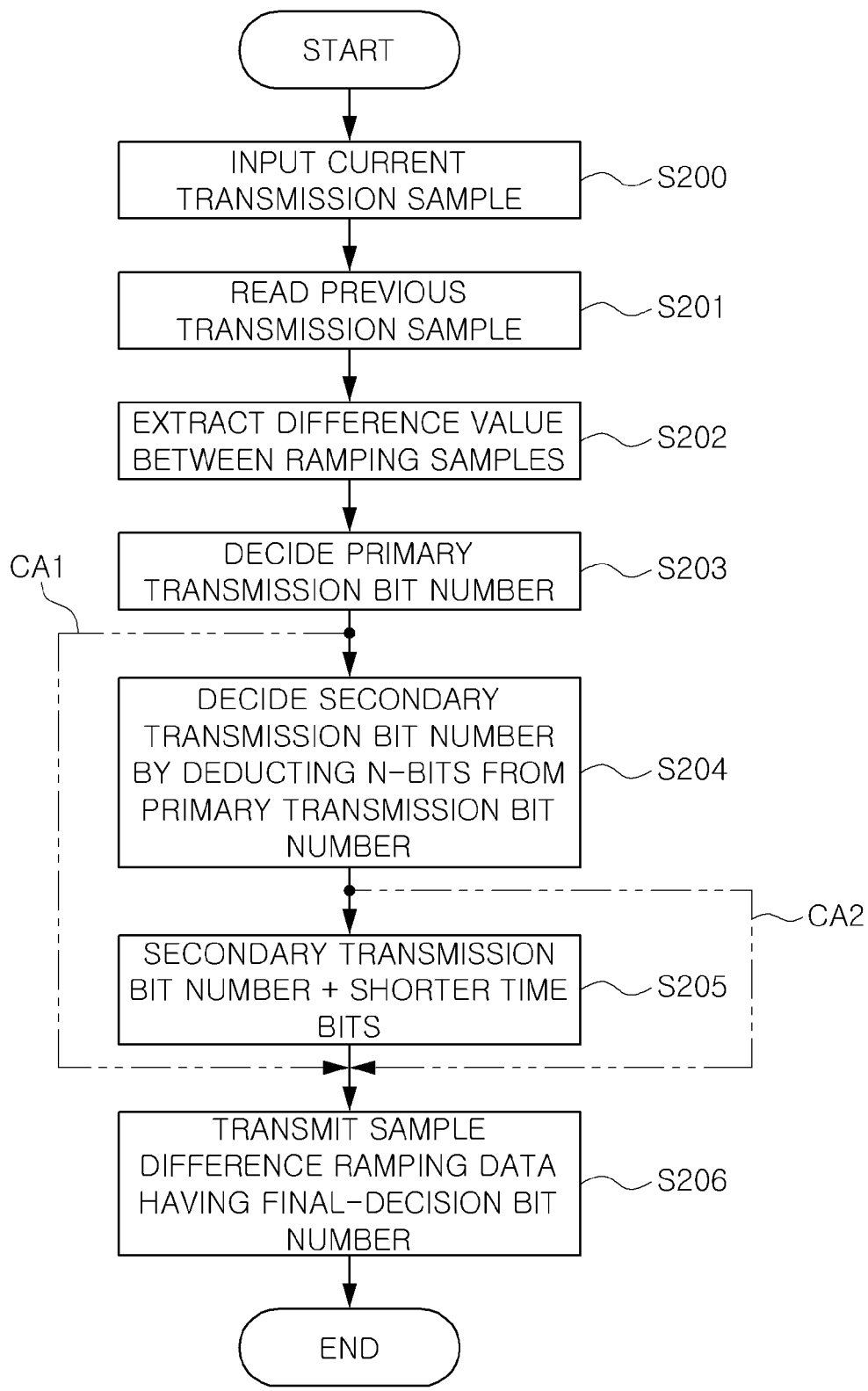
FIG. 2 is a flowchart illustration the generation and control of ramping data in a digital baseband processing unit of FIG. 1 according to an embodiment of the invention.

FIG. 2 is a flowchart for generation and control of ramping data in the DBB processing unit of FIG. 1. Referring to FIG. 2, a controller of the DBB processing unit 100 receives a current transmission ramping sample in a step S200. In a step S201, a previous input ramping sample is read. Then, the controller extracts a difference value between two ramping samples in a step S202 of FIG. 2. That is, a difference value of ramping data of predetermined first bit number, i.e., 10 bits, for a ramping sample to be transmitted, from a previous ramping sample, is extracted without transmitting the ramping data intact. The controller decides a primary transmission bit number in a step S203. For example, when the ramping data to be generally transmitted is predetermined as 10 bits, in the step S203 it is decided as 8 bits through the execution of the step S202. The sample difference ramping data of 8 bits may be decided and transmitted as the primary transmission bit number, but steps S204 and S205 are added to further reduce the transmission amount.

The step S204 is to decide a secondary transmission bit number by deducting n-bits of a lower level from a decided bit number when the primary transmission bit number is decided, n being 2, 3, 4, 5. For example, when 2 bits is deducted, sample difference ramping data is decided as 6 bits. The step S205 is selectively applied to further add 1 bit of a time-shortening bit to the decided secondary transmission bit number, the 1 bit of time-shortening bit being to shorten a maximum or minimum value reach time for ramping data within a ramping profile. For example, when 1 bit is added, the sample difference ramping data is decided as 7 bits. The sample difference ramping data having a bit number (in this case, 7 bits) finally decided in a step S206 is obtained and transmitted to the ABB processing unit 200 through the serial interface.

In the drawings, a reference number CA1 indicates that the steps S204 and S205 are skipped and sample difference ramping data is transmitted, and a reference number CA2 indicates that the sample difference ramping data is transmitted without performing the step S205.

Although the maximum reduction in transmission amount may be achieved by performing all of the steps S204 and S205, methods associated with CA1 or CA2 may be adopted.

Figure 4:
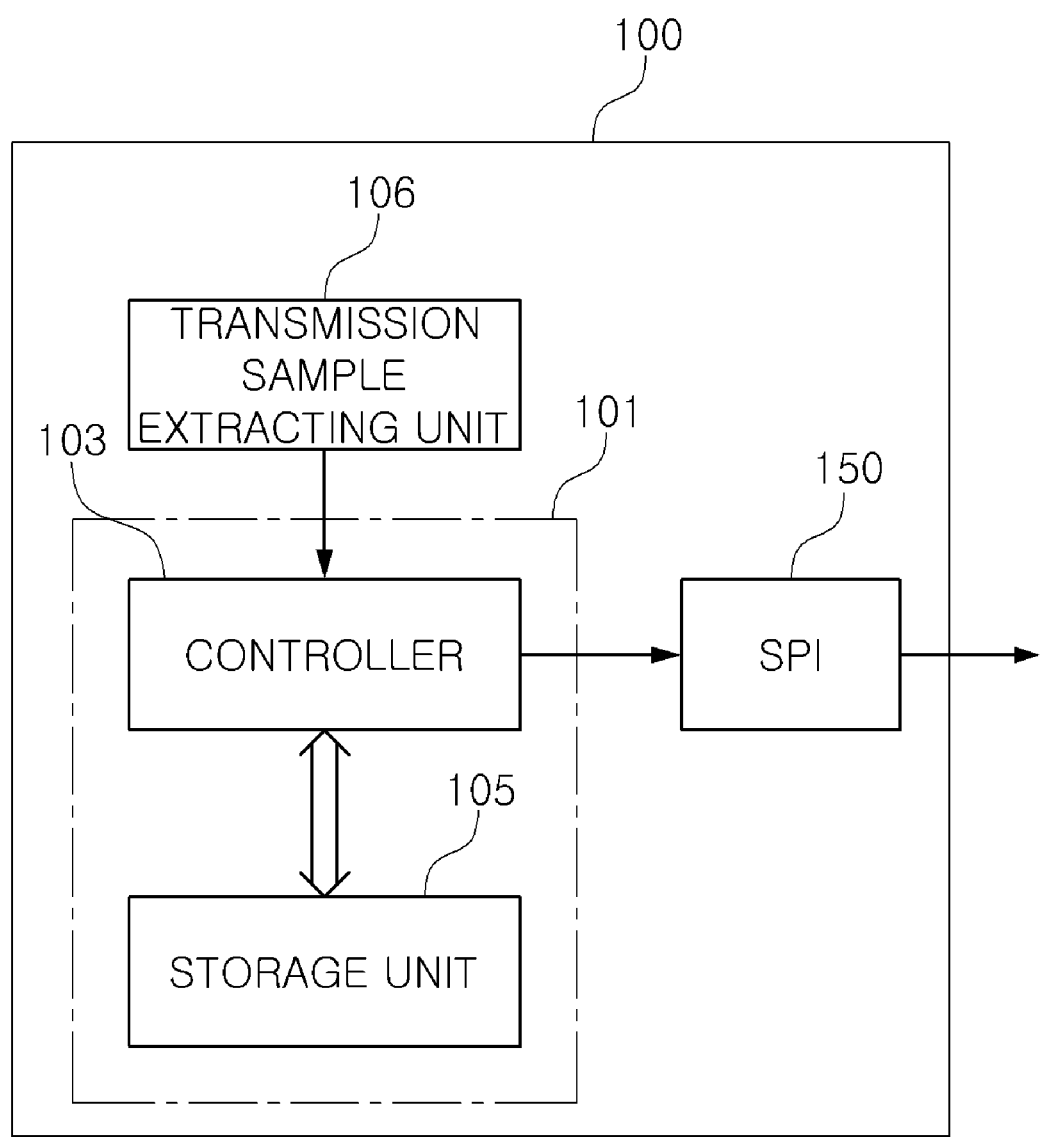
FIG. 4 is a block diagram illustrating a digital baseband processing unit of FIG. 1 according to an embodiment of the invention.

Respective steps of FIG. 2 are performed by the controller 103 of FIG. 4, and for that, a program to perform the respective steps of FIG. 2 may be loaded in a program memory of the controller 103. However, instead of such programming, sample difference ramping data can be generated and transmitted by using a dedicated gate logic or DSP.

When sample difference ramping data having a bit number smaller than a bit number of ramping data to be transmitted is transmitted, the transmission amount is reduced and the capacity of ramp memory of the ABB processing unit as the receiving party is also reduced.

Figure 3:
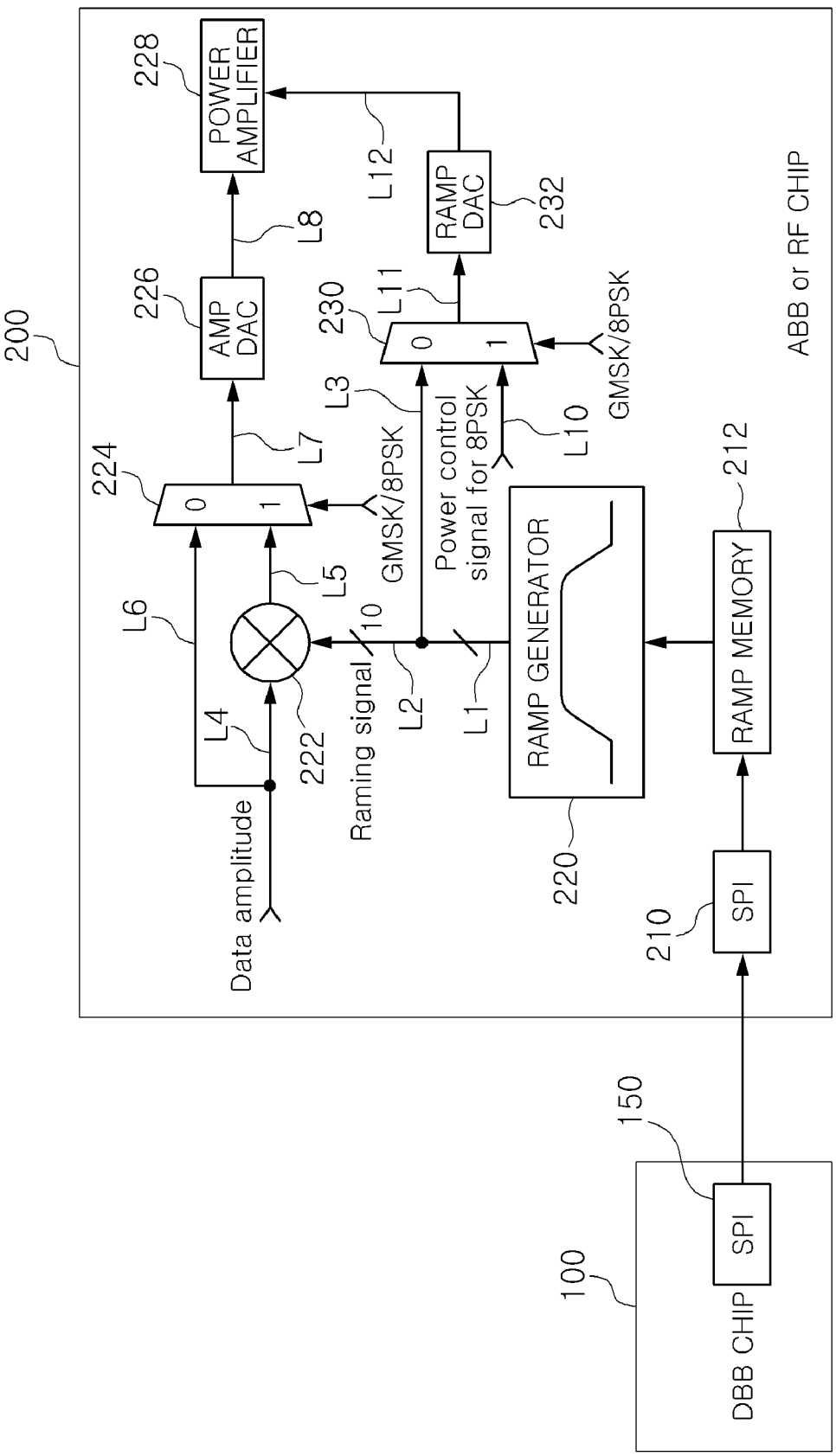
FIG. 3 is a circuit diagram of analog baseband processing unit or radio frequency processing unit of FIG. 1 according to an embodiment of the invention.

FIG. 3 is a circuit diagram illustrating ABB processing unit or radio frequency chip referred to in FIG. 1, coupled to DBB processing unit 100, according to an embodiment of the invention.

With reference to FIG. 3, the ABB processing unit 200 includes a serial interface unit 210 receiving the sample difference ramping data, a ramp memory 212 storing the sample difference ramping data output from the serial interface unit 210, and a ramp generator 220 reading the stored-sample difference ramping data from the ramp memory 220 and then generating a ramping up/down signal of the first bit number (e.g., 10 bits) to control an output power level of power amplifier 228 adapted in the ratio communication device. It will be understood that the circuit of reference number 200 in FIG. 3 may be an RF chip.

In the ramp generator 220, when sample difference ramping data having a bit number obtained through the step S204 excluding step S205 of FIG. 2 is transmitted, K (K being 2, 3, 4, 5) is left-bit-shifted and restored to original sample difference ramping data, and then, in a ramping-up, the restored-sample difference ramping data is added to previous sample data and thus current sample data is generated. For example, when the sample difference ramping data of 6 bits is read from the ramp memory, the read-sample difference ramping data is left-shifted by 2 bits and thus is restored to sample difference ramping data of 8 bits. After that, current sample data of 10 bits is generated from the ramp generator 220 through an addition to or deduction from the previous sample data. On the other hand, in a ramping-down, the restored-sample difference ramping data is deducted from the previous sample data, and thus current sample data is generated. The current sample data indicates a ramping up/down signal of the first bit number, i.e., 10 bits. Further, in the ramp generator 220, when sample difference ramping data having a dummy bit number obtained through the step S205 of FIG. 2 is transmitted, it is decided whether either maximum or minimum ramping data have been transmitted, on the basis of the value of the dummy bit. That is, in a transmission with a state that a 1-bit dummy bit is further added for an option to shorten a maximum value or minimum value reach time, it is decided whether either maximum or minimum ramping data have been transmitted, on the basis of the logic state of the dummy bit.

In FIG. 3, a ramping signal output from an output line L1 of the ramp generator 220 is divided into lines L2 and L3. First and second multiplexers 224 and 230 each output a selected signal to selection output lines L7 and L11 in response to a mode selection signal indicating a GMSK mode or 8PSK mode. Here, the GMSK mode or 8PSK mode is described in brief. In a specific communication network such as GSM, it is proposed to enhance a data rate through a new standard such as an EGPRS (Enhanced General Packet Radio Service) standard. For example, the EGPRS standard improves a data transmission speed proposed by a previous GMSK (Gaussian Minimum Shift Keying) modulation system, by applying a new modulation system called an 8PSK (8 Phase Shift Keying) in a GSM communication network. To obtain an adaptability of data transmission, the EGPRS standard defines a multi-time slot (or multislot) and multi-mode operation that require the use of at least one time slot in eight time slots that divide a GSM frame to perform a data transmission through the GMSK or 8PSK modulation system. That is, an EGPRS mobile telecommunication equipment must include a modulator capable of simply changing a GMSK modulation system into an 8PSK modulation system or vice versa in a continuous-time slot. However, as is well-known in the art, in GMSK, a saturated power amplification through a given envelope modulation system can be used with a high efficiency. In the meantime, 8PSK is a modulation system to transfer a modulated carrier varied not only in a phase but also in an amplitude, and thus the 8PSK does not allow the use of saturated power amplification, but can allow the use of linear power amplification.

Referring back to FIG. 3, the second multiplexer 230 provides a ramping signal applied through input line L3, to line L11, in a GMSK mode. An output of the line L11 is converted into an analog signal through a DAC (Digital-to-Analog Converter) 232, and then is provided to a power control pin of a power amplifier. Then, an output power level of the power amplifier is controlled. On the other hand, when the 8PSK mode is selected, the first multiplexer 224 selects as an output, an input coupled to a line L5. A result obtained by multiplying the ramping signal by the amplitude of transmission data through a multiplier 222 is provided to the line L5. An output outputted through the line L7 is converted into an analog signal through the AMP DAC 226 as a digital-to-analog converter and then is output to line L8. The analog signal output to the line L8 is applied to the power amplifier 228, to control an output power of the power amplifier 228. The AMP DAC 226 is generally a 10 bit DAC based on a signal to noise ratio (SNR) specification. Thus, ramping samples of 10-bit size are used.

In an embodiment of the invention, the DBB processing unit 100 does not transmit data of 10 bits per one ramping sample to the serial interface unit 210, but transmits after dataizing a difference value between mutually adjacent ramping samples, thereby reducing a data transmission amount through the serial interface and a capacity of the ramp memory 212. Therefore, the transmission amount of ramping data is reduced. Thus, noise influence is substantially reduced at a receiving party, and a capacity of ramp memory 212 accessed by ramp generator 220 is reduced.

FIG. 4 is a block diagram illustrating a digital baseband processing unit of FIG. 1 according to an embodiment of the invention.

As shown in FIG. 4, the digital baseband processing unit includes a transmission sample extracting unit 106, a storage unit 105, a controller 103 and a serial interface unit 150.

The transmission sample extracting unit 106 may extract ramping data for a transmission ramping sample. The storage unit 104 may receive the ramping data extracted from the transmission sample extracting unit 106, and store it in a memory area. The controller 103 is coupled to the transmission sample extracting unit 106 and the storage unit 105, and may extract a difference value between the extracted ramping data and a previous ramping data stored in the storage unit, and generate the same as sample difference ramping data having a second bit number which is smaller than the first bit number. The serial interface unit 150 may transmit the sample difference ramping data in serial to the analog baseband processing unit. Further, the controller 103 may perform a control flow as described above with reference to FIG. 2, and thus generate and transmit sample difference ramping data.

Figure 5:
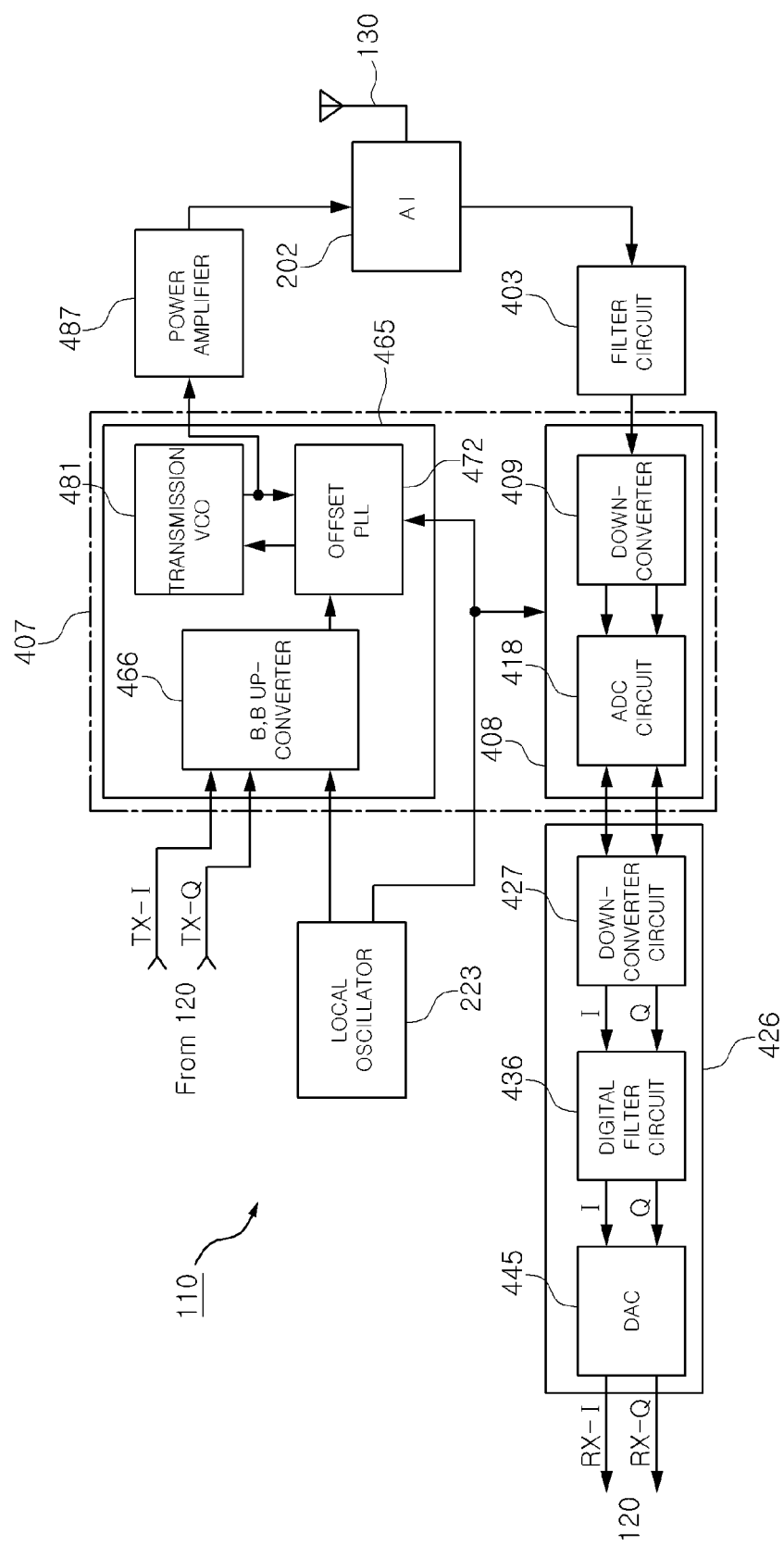
FIG. 5 is a block diagram illustrating a radio frequency processing unit of FIG. 1 according to an embodiment of the invention.

FIG. 5 is a block diagram illustrating a radio frequency processing unit shown in FIG. 1 according to an embodiment of the invention.

As shown in FIG. 5, the radio frequency processing unit comprises a receiver analog circuit 408, a receiver digital circuit 426 and a transmitter circuit 465. A power amplifier of FIG. 5 may be the same functional element as the power amplifier 228 described above with reference to FIG. 3.

In a receiving mode, an antenna interface circuit 202 supplies an RF signal to a filter circuit 403. The filter circuit 403 performs filtering on the RF signal and transmits the filtered-RF signal to the receiver analog circuit 408. The receiver analog circuit 408 includes a down converter (i.e., mixer) circuit 409 and an ADC (analog-to-digital converter) circuit 418. The down converter circuit 409 mixes the filtered-RF signal with an RF local oscillator signal received from a local oscillator circuit 223. The down converter circuit 409 supplies an in-phase analog down-converted signal, i.e., I-channel signal, and a quadrature phase analog down-converted signal, i.e., Q-channel signal, to ADC circuit 418. The ADC circuit 418 converts the in-phase analog down-converted signals and the quadrature phase analog down-converted signal into a 1-bit in-phase digital received signal and a 1-bit quadrature phase digital received signal. Thus, the ADC circuit 418 supplies the 1-bit in-phase digital received signal and the 1-bit quadrature phase digital received signal to the receiver digital circuit 426. The receiver digital circuit 426 comprises a digital down converter circuit 427, a digital filter circuit 436 and a DAC (digital-to-analog) circuit 445. The digital down converter circuit 427 receives 1-bit in-phase digital received signal and 1-bit quadrature phase digital received signal from the receiver analog circuit 408. The digital down converter circuit 427 converts the received signals into a down-converted in-phase signal and a down-converted quadrature phase signal, and supplies the signals to the digital filter circuit 436. The digital filter circuit 436 comprises an IIR (infinite impulse response) channel selection filter performing various kinds of filtering operations for its input signal. The digital filter circuit 436 may have a programmable response characteristic. When necessary, other type of filter, i.e., finite impulse response or FIR filter, that provides a fixed response characteristic or programmable response characteristic, may be used in place of the IIR filter.

The digital filter circuit 436 supplies a digital in-phase filtered signal and a digital quadrature phase filtered signal to the DAC circuit 445. The DAC circuit 445 converts individually the digital in-phase filtered signal and the digital quadrature phase filtered signal into an in-phase analog received signal RX-I and a quadrature phase analog received signal RX-Q. The baseband processing unit 120 receives the in-phase analog received signal and the quadrature phase analog received signal for further processing.

The transmitter circuit 465 includes a baseband up-converter circuit 466, an offset PLL (phase-lock-loop) circuit 472 and a transmission voltage control oscillator (VCO) circuit 481. The transmission VCO circuit 481 generally has a low-noise circuit and is sensitive to an external noise. For example, interference from a digital switching by a high gain generated in a resonance LC tank circuit adapted within the transmission VCO circuit 481 may be picked up. The baseband up-converter circuit 466 receives an intermediate frequency (IF) local oscillator signal from a local oscillator circuit 223. The baseband up-converter circuit 466 mixes the IF local oscillator signal with an analog in-phase transmission input signal and an analog quadrature phase transmission input signal, and supplies an up-converted IF signal to the offset PLL circuit 472. The offset PLL circuit 472 effectively filters the IF signal.

In other words, the offset PLL circuit 472 passes a signal of the bandwidth, but offsets other signals. The offset PLL circuit 472 offsets an optional pseudo-signal or noise signal except the bandwidth so as to reduce a requirement for a filtering of antenna 130 and reduce system overhead, insertion loss and power consumption. The offset PLL circuit 472 forms a feedback loop, together with the transmission VCO circuit 481 through a medium of an offset PLL output signal and a transmission VCO output signal. The transmission VCO circuit 481 may have a given amplification output signal. The offset PLL circuit 472 employs a mixer to mix an RF local oscillator signal with the transmission VCO output signal. The power amplifier 487 receives the transmission VCO output signal of the transmission VCO circuit 481 and supplies an amplified RF signal to an antenna interface circuit 202. The antenna interface circuit 202 and an antenna 130 operate as described above.

Figure 6:
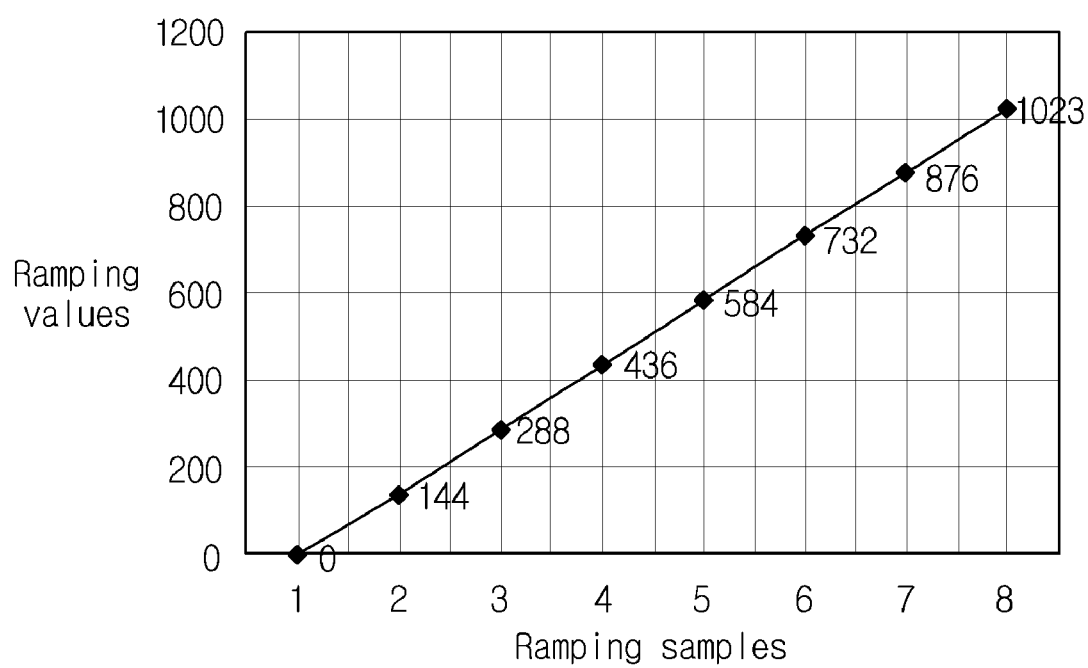
FIGS. 6 and 7 each graphically illustrate transmission examples of sample difference ramping data in a digital baseband processing unit of FIG. 4 according to an embodiment of the invention.
Figure 7:
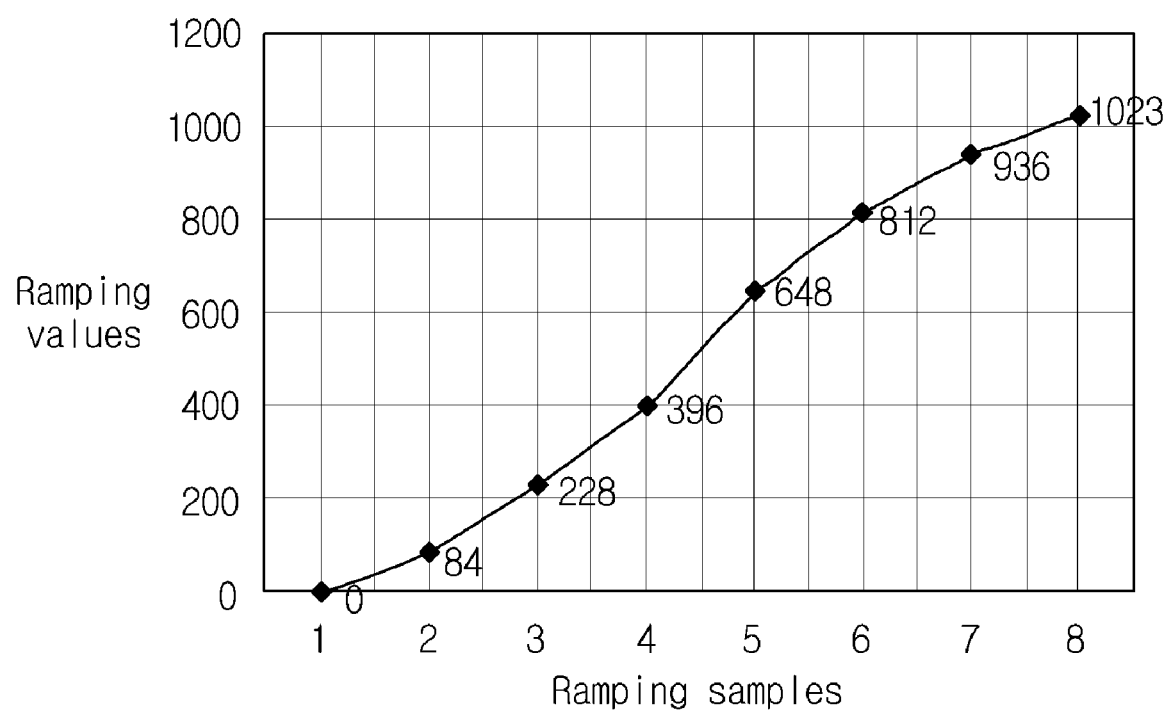

FIGS. 6 and 7 graphically illustrate examples of transmitting sample difference ramping data from a digital baseband processing unit of FIG. 4 when a ramping profile is formed of 8 samples.

FIG. 6 illustrates a linear shape in which eight samples form one ramping-up shape. As shown in FIG. 6 and Table 1 below, six difference values between samples are individually represented as 144, 144, 148, 148, 148, 144.

TABLE 1

| | Ramping samples | | | | | | | |
|---|---|---|---|---|---|---|---|---|
| | 1 | 2 | 3 | 4 | 5 | 6 | 7 | 8 |
| Ramping values | 0 | 144 | 288 | 436 | 584 | 732 | 876 | 1023 |
| Sample difference | | 144 | 144 | 148 | 148 | 148 | 144 | |
| Transmitted-data | | 36 | 36 | 37 | 37 | 37 | 36 | |

More specifically, a maximum difference value between adjacent ramping samples in 8 ramping values is 148, and this value is available to be represented as 8 bits. Here, when removing 2 bits of a low level, transmission date can be formed of values of 6 bits. Consequently, data received as 6 bits is restored to 8 bits through a ramp generator, and again, is added to or deducted from previous sample data, thus generating ramping data of 10 bits.

FIG. 7 illustrates a shape of sine wave when 8 samples form one ramping-up shape. As illustrated in FIG. 7 and Table 2 below, six difference values between samples are each 84, 144, 168, 252, 164 and 124.

TABLE 2

| | Ramping samples | | | | | | | |
|---|---|---|---|---|---|---|---|---|
| | 1 | 2 | 3 | 4 | 5 | 6 | 7 | 8 |
| Ramping values | 0 | 84 | 228 | 396 | 648 | 812 | 936 | 1023 |
| Sample difference | | 84 | 144 | 168 | 252 | 164 | 124 | |
| Transmitted-data | | 21 | 36 | 42 | 63 | 41 | 31 | |

More specifically, a maximum difference value between adjacent ramping samples in 8 ramping values is 252, and this value is available to be represented as 8 bits. Here, when removing 2 bits of a low level, transmission date can be formed of values of 6 bits. Similarly, data received as 6 bits is restored to 8 bits through a ramp generator, and again, is added to or deducted from previous sample data, thus generating ramping data of 10 bits. Further, when a ramping profile is formed of 16 samples, a maximum difference value between adjacent ramping samples is 124, and this value is available to be represented as 7 bits. Here, when removing 2 bits of a low level, transmission data can be transmitted as a value of 5 bits.

An example for a reduction of ramping data according to an embodiment of the invention will be described next.

A ramp generator 220 of FIG. 3 generates a ramping up-signal and a ramping-down signal to be applied through a power control pin of a power amplifier 228 when in a GMSK modulation mode. On the other hand, in an 8PSK modulation mode, ramping up/down signals generated in the ramp generator 220 are multiplied by an amplitude of transmission data, and then are used for controlling an output power level. Thus, the ramp generator 220 is used in generating a ramping signal in both of the GMSK mode and 8PSK mode. To generate ramping up/down signals in the ramp generator 220, a ramping profile is stored in advance in a RAMP memory 212 before a TX burst transmission. That is, the DBB processing unit 100 transmits data of a ramping profile through a serial interface 150 before the TX burst is generated. Then, the ramp generator 220 generates a ramping-up signal at a start portion of burst through a control of the DBB processing unit 100, and generates a ramping-down signal at a last portion of the burst. For example, when a multi-slot must be transmitted, ramping-up and ramping-down may be successively generated between slots. All of amplitude DAC 226 and ramping DAC 232 referred to in FIG. 3 are realized as a general 10-bit DAC based on the SNR specification.

For this reason ramping samples formed of 10 bit number are used as an example. That is, in a ramping profile for a ramping-up, a sample value is increased from 0 to 1023. On the other hand, in a ramping-down, a sample value is getting reduced from 1023 to 0. The ramping profile is for one of gradually-increasing and gradually-decreasing, and thus a difference value from other sample value of 10 bits obtained promptly before the sample value of 10 bits is transmitted in place of transmitting all samples values of 10 bits. It is thus not necessary to transmit data of 10 bits for every respective sample.

A resolution for lower level 2 bits of the ramping sample does not significantly influence a performance of the TX ramping-up/down, and thus, when this is removed, the amount of transmission data is reduced relatively more. Through such two-combined method, a ramping data amount to be transmitted according to an embodiment of the invention can be reduced.

That is, for example, when in an assumption that a ramping profile increases linearly, one ramping profile is formed of 8 samples as shown in FIG. 6; the mean of difference values between adjacent samples may be 146 (=1023/7). 8 bits can be applied to until 255, thus this value (mean 146) can be represented as 8 bits. This 8 bits corresponds to a result decided as a primary transmission bit number in a step S202 of FIG. 2. Here, when removing a lower level 2 bits that is available to be disregarded, it is valid to represent a value of 4~252 with a value of 6 bits. This 6 bits corresponds to a result value of step S204 referred to in FIG. 2. Such level value can form even for a ramping profile not being linear like in FIG. 7.

For example, when one ramping profile is formed of 16 samples, a ramping profile can be sufficiently obtained with only a value of 5 bits. That is, when the number of samples constituting one ramping profile is getting increased, a value difference between samples is reduced more, thus the effect in some embodiments of the invention may become greater like in a long ramping profile when one ramping profile is formed of relatively more numbers of samples. For example, when one ramping profile is formed of 16 samples, the ramp memory capacity and the transmission data amount can be reduced by half by transmitting only a difference value of 5 bits in place of transmitting a ramping sample of 10 bits.

In a ramping-up, a first sample value is 0 and a last sample value is 1023, and thus only six difference values between samples are transmitted when 8 samples constitute one ramping profile. In a ramping-down, on the contrary, a first sample is 1023 and a last sample is 0.

For example, the number of samples constituting one ramping-up shape and time between samples are locked, but to further shorten time to reach 1023 as a maximum value MAX or to reach 0 as a minimum value, it also needs to transmit a value of 1023 or 0. In this case, as illustrated in a step S205 of FIG. 2, 1 bit as a time-shortening bit is sent additionally as a dummy bit, and when the logic state of the dummy bit becomes '1', a receiving party decides that a value of 0 or 1023 has been transmitted, not a transmission of a difference value between samples. For example, when the logic state of the dummy bit is 0, the receiving party decides that neither maximum or minimum ramping data have been transmitted.

It will be apparent to those skilled in the art that modifications and variations can be made in the present invention without deviating from the inventive spirit or scope. Thus, it is intended that the present invention cover any such modifications and variations of this invention provided they come within the scope of the appended claims and their equivalents. For example, in other cases, a predetermined bit number for a ramping sample can increase or decrease, and further a bit number of sample difference ramping data may be appropriately increased or decreased on a case by case basis. Additionally, the configuration of digital baseband processing unit and analog baseband processing unit may be realized as various processors or dedicated integrated logic circuits. Furthermore, the ramp memory may have a memory array structure of DDR2 type or DDR3 type, and the mobile telecommunication device may be personal computer, notebook computer, portable multimedia electronic devices of HHP (Hand Held Phone) or PMP, etc. Accordingly, these and other changes and modifications are seen to be within the inventive true spirit and scope as defined by the appended claims.

In the drawings and specification, there have been disclosed embodiments of the invention and, although specific terms are employed, they are used in a generic and descriptive sense only and not for limitation, the inventive scope being set forth in the following claims.

What is claimed is:

1. A method of operating a mobile telecommunication device including a power amplifier, a digital baseband processing unit (DBB) including a controller, and an analog baseband processing unit (ABB) including a ramp generator, the method comprising:
   receiving current ramping sample data having a first bit number in the DBB;
   reading previous ramping sample data;
   using the controller to extract a sample difference value between the current ramping sample data and the previous ramping sample data;
   converting the sample difference value into sample difference ramping data having a second bit number less than the first bit number;
   transmitting the sample difference ramping data from the DBB to the ABB via a serial interface;
   generating a ramping up/down signal having the first bit number using the ramp generator in response to the sample difference ramping data; and
   controlling a power amplifier in response to the ramping up/down signal.

2. The method of claim 1, wherein the first bit number is 10 bits.

3. The method of claim 2, wherein the second bit number is 8 bits.

4. The method of claim 3, further comprising:
   performing a digital to analog conversion on the ramping up/down signal in the ABB before controlling the power amplifier in response to the ramping up/down signal.

5. The method of claim 1, wherein converting the sample difference value into the sample difference ramping data comprises removing N lower level bits from the sample difference value, wherein, the N is equal to a value in a set of values consisting of 2, 3, 4 and 5.

6. The method of claim 5, wherein generating the ramping up/down signal having the first bit number using the ramp generator in response to the sample difference ramping data comprises adding N lower level bits to the sample difference ramping data.

7. The method of claim 1, wherein the first bit number is 10 bits, and the second bit number is 5 bits.

8. The method of claim 6, wherein N is equal to 2.

9. The method of claim 1, wherein converting the sample difference value to the sample difference ramping data comprises adding at least one dummy bit to the sample difference value.

10. The method of claim 9, further comprising:
determining in the ABB whether at least one of a sample maximum value and a sample minimum value for transmission data has been transmitted in response to the dummy bit.

11. A mobile telecommunication device comprising:
a digital baseband processing unit (DBB) including a controller that receives current ramping sample data and previous ramping sample data, extracts a sample difference value having a first bit number between the current ramping sample data and the previous ramping sample data, and converts the sample difference value into sample difference ramping data having a second bit number less than the first bit number; and
an analog baseband processing unit (ABB) that receives the sample difference ramping data, generates a ramping up/down signal having the first bit number in response to sample difference ramping data, and controlling a power amplifier in response to the ramping up/down signal.

12. The device of claim 11, wherein the DBB comprises:
a transmission sample extracting unit configured to extract ramping data for from a ramping sample to be transmitted;
a storage unit configured to receive and store the ramping data in a memory area;
a controller coupled to the transmission sample extracting unit and the storage unit, and configured to extract the sample difference value between the ramping data and previous ramping data stored at the storage unit; and
a serial interface unit configured to transmit in series the sample difference ramping data to the analog baseband processing unit.

13. The device of claim 12, wherein the ABB comprises:
a serial interface unit configured to receive the sample difference ramping data;
a ramp memory configured to store the sample difference ramping data; and
a ramp generator configured to read the stored sample difference ramping data from the ramp memory, and generate according to the sample difference ramping data the ramping up/down signal.

14. The device of claim 13, wherein the transmission sample extracting unit extracts the first bit number as 10 bits.

15. The device of claim 14, wherein the controller generates the second bit number as 8 bits.

16. The device of claim 15, wherein the ramping sample to be transmitted is predetermined as 8 samples for one ramping profile.

17. The device of claim 14, wherein the controller removes N-bit of a lower level from the sample difference value to the sample difference ramping data, wherein N is equal to a value in a set of values consisting of 2, 3, 4 and 5.

18. The device of claim 17, wherein the ramp generator generates the ramping up/down signal, wherein the ramping up/down signal is used in a GMSK or 8PSK mode.

19. A mobile telecommunication device comprising:
a digital baseband processing unit (DBB) including a controller that receives current ramping sample data and previous ramping sample data, extracts a sample difference value having a first bit number between the current ramping sample data and the previous ramping sample data, and converts the sample difference value into sample difference ramping data having a second bit number less than the first bit number; and
a radio frequency processing unit that receives the sample difference ramping data, generates a ramping up/down signal having the first bit number in response to the sample difference ramping data, and controls a power amplifier in response to the ramping up/down signal.

20. The device of claim 19, wherein the controller of the DBB adds at least one dummy bit to generate the sample difference ramping data.

* * * * *